United States Patent
Khan

(10) Patent No.: US 11,107,684 B2
(45) Date of Patent: *Aug. 31, 2021

(54) DIAMOND SEMICONDUCTOR SYSTEM AND METHOD

(71) Applicant: Adam Khan, San Francisco, CA (US)

(72) Inventor: Adam Khan, San Francisco, CA (US)

(73) Assignee: AKHAN Semiconductor, Inc., Gurnee, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/773,891

(22) Filed: Jan. 27, 2020

(65) Prior Publication Data

US 2020/0266067 A1 Aug. 20, 2020

Related U.S. Application Data

(63) Continuation of application No. 15/406,546, filed on Jan. 13, 2017, now Pat. No. 10,546,749, which is a
(Continued)

(51) Int. Cl.
*H01L 33/00* (2010.01)
*H01L 21/04* (2006.01)
*H01L 21/205* (2006.01)
*H01L 29/16* (2006.01)
*H01L 29/78* (2006.01)
*H01L 29/868* (2006.01)
(Continued)

(52) U.S. Cl.
CPC ...... *H01L 21/0415* (2013.01); *H01L 21/0237* (2013.01); *H01L 21/0262* (2013.01);
(Continued)

(58) Field of Classification Search
CPC ......... H01L 21/02532; H01L 21/02085; H01L 21/0415; H01L 21/02376; H01L 21/02444; H01L 21/02527; H01L 21/3146; H01L 28/22; H01L 29/1602; H01L 29/66015; H01L 29/0405; H01L 21/02; H01L 21/04; H01L 21/0237; H01L 21/02381; H01L 21/02488; H01L 21/02573; H01L 21/02576; H01L 21/0262; H01L 21/043; H01L 21/0405; H01L 29/06; H01L 29/16; H01L 29/66; H01L 29/78; H01L 29/6603; H01L 29/66045; H01L 29/868; H01L 29/778; H01L 29/7781; H01L 29/1606; H01L 31/028; H01L 33/00; H01L 33/005;
(Continued)

(56) References Cited

U.S. PATENT DOCUMENTS 10,546,749 B2 * 1/2020 Khan ............... H01L 21/0262

* cited by examiner

*Primary Examiner* — Chuong A Luu
(74) *Attorney, Agent, or Firm* — The Thompson Law Office, P.C.; Lawrence E. Thompson

(57) ABSTRACT

Disclosed herein is a new and improved system and method for fabricating monolithically integrated diamond semiconductor. The method may include the steps of seeding the surface of a substrate material, forming a diamond layer upon the surface of the substrate material; and forming a semiconductor layer within the diamond layer, wherein the diamond semiconductor of the semiconductor layer has n-type donor atoms and a diamond lattice, wherein the donor atoms contribute conduction electrons with mobility greater than 770 cm$^2$/Vs to the diamond lattice at 100 kPa and 300K, and Wherein the n-type donor atoms are introduced to the lattice through ion tracks.

9 Claims, 14 Drawing Sheets

Related U.S. Application Data continuation of application No. 14/615,311, filed on Feb. 5, 2015, now abandoned, which is a continuation of application No. 13/734,986, filed on Jan. 6, 2013, now abandoned.

(60) Provisional application No. 61/583,841, filed on Jan. 6, 2012.

(51) Int. Cl.
| | |
|---|---|
| *H01L 21/02* | (2006.01) |
| *H01L 33/34* | (2010.01) |
| *H01L 21/3065* | (2006.01) |
| *H01L 31/028* | (2006.01) |
| *H01L 29/66* | (2006.01) |
| *H01L 29/06* | (2006.01) |
| *H01L 29/778* | (2006.01) |

(52) U.S. Cl.
CPC ........... *H01L 21/02085* (2013.01); *H01L 21/02381* (2013.01); *H01L 21/02444* (2013.01); *H01L 21/02488* (2013.01); *H01L 21/02527* (2013.01); *H01L 21/02573* (2013.01); *H01L 21/02576* (2013.01); *H01L 21/043* (2013.01); *H01L 21/2053* (2013.01); *H01L 21/3065* (2013.01); *H01L 29/06* (2013.01); *H01L 29/1602* (2013.01); *H01L 29/6603* (2013.01); *H01L 29/66045* (2013.01); *H01L 29/78* (2013.01); *H01L 29/868* (2013.01); *H01L 31/028* (2013.01); *H01L 33/34* (2013.01); *H01L 29/1606* (2013.01); *H01L 29/7781* (2013.01); *H01L 33/005* (2013.01); *Y02E 10/547* (2013.01)

(58) Field of Classification Search
CPC ........... H01L 33/34; H01L 2021/26573; H01L 2924/10254; Y02E 10/547
USPC .......................................................... 438/105
See application file for complete search history.

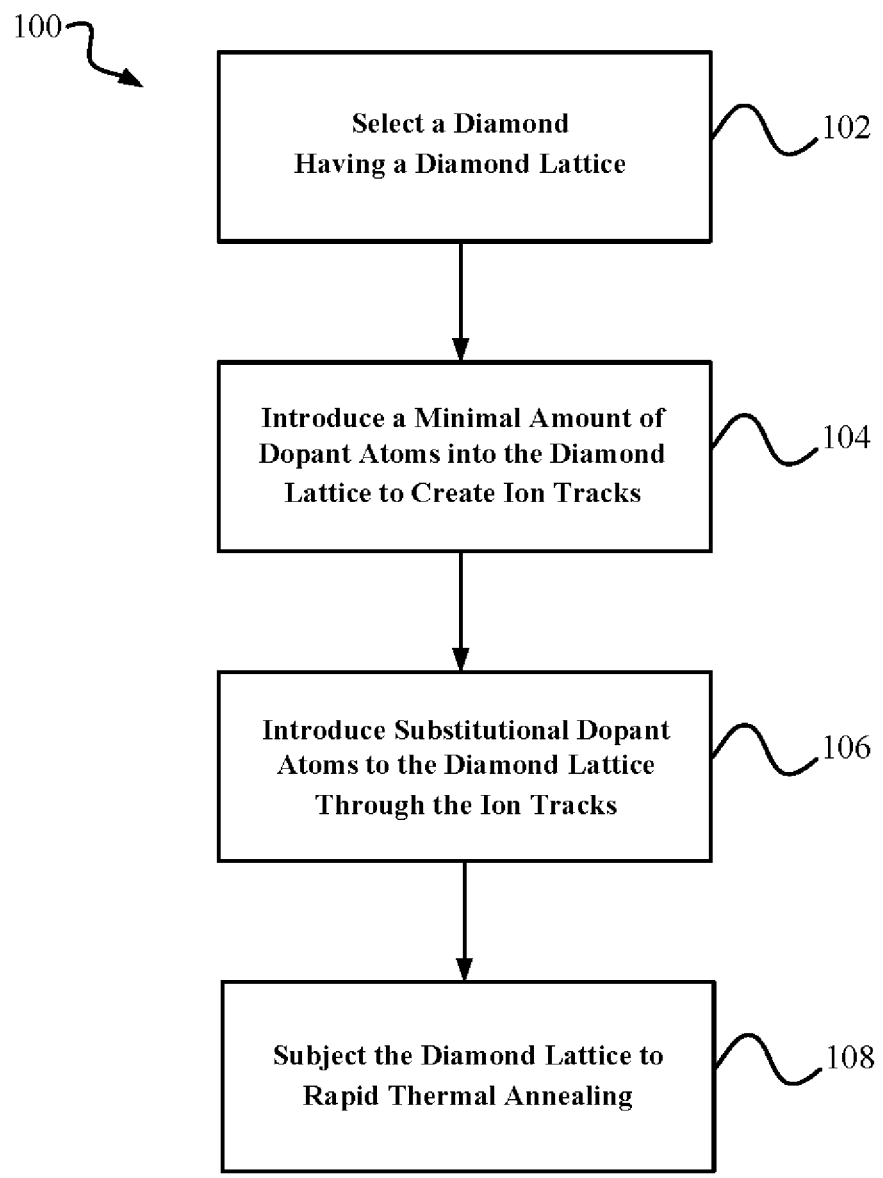

FIG. 5A
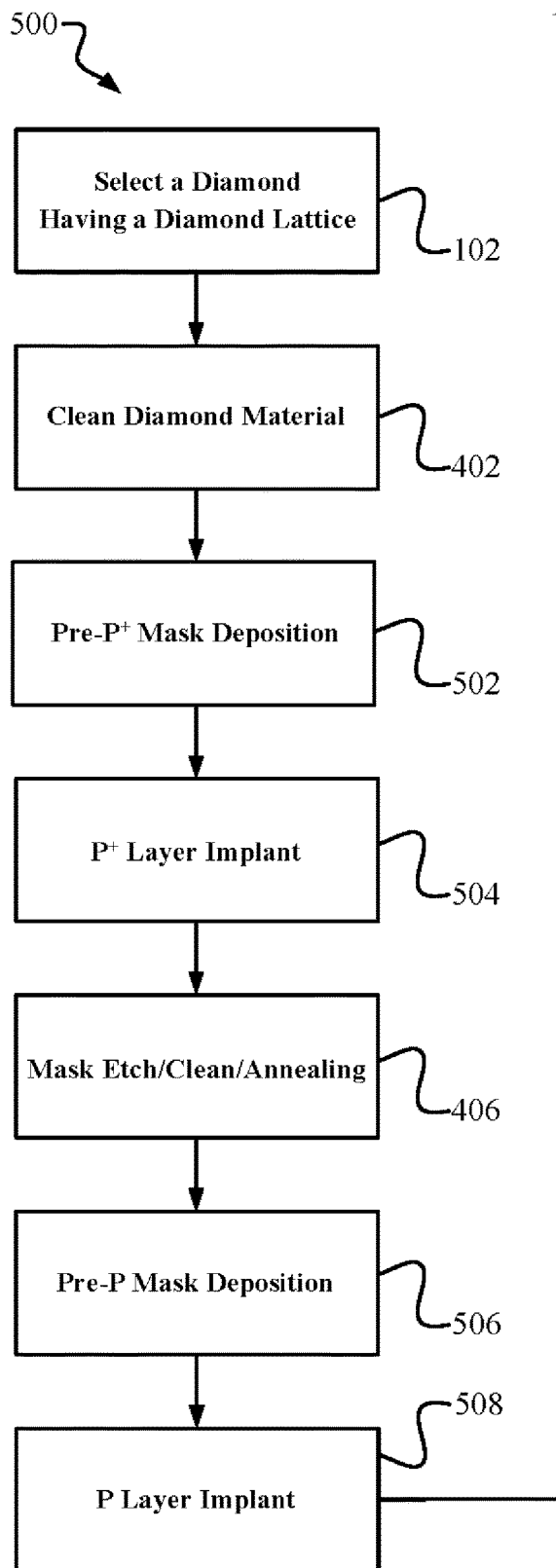
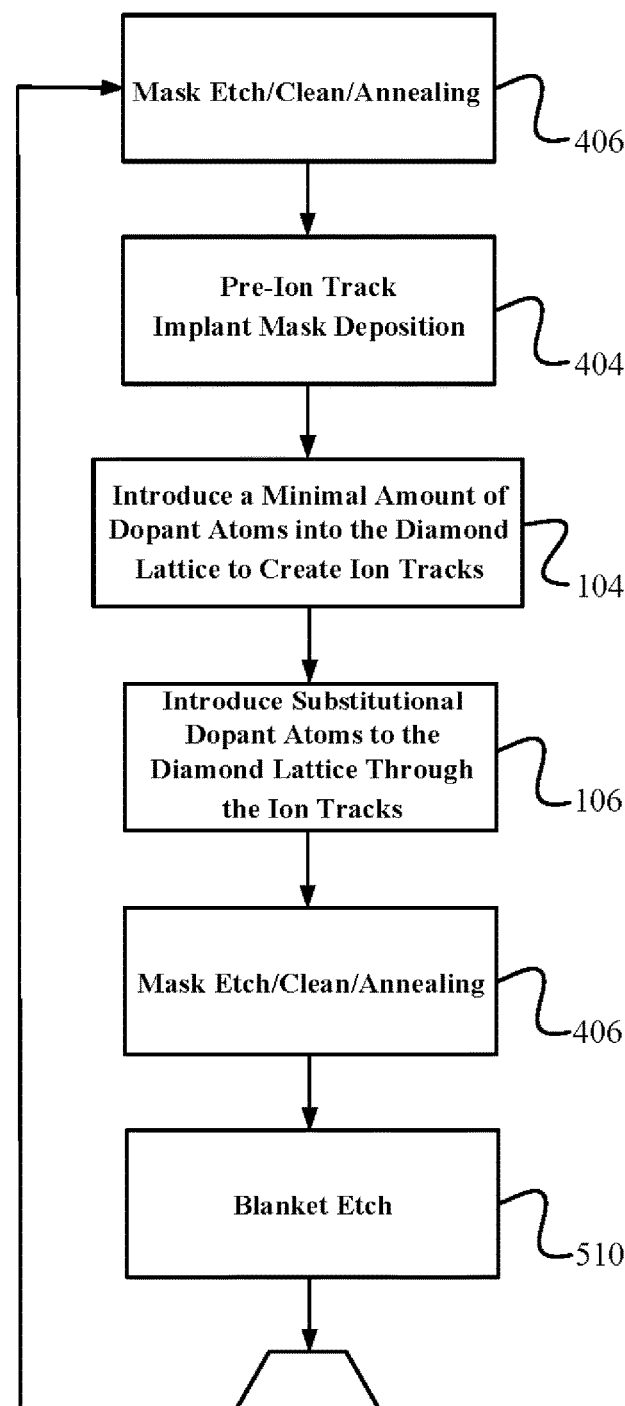

DIAMOND SEMICONDUCTOR SYSTEM AND METHOD

CROSS-REFERENCE TO RELATED APPLICATION

This application claims the benefit of U.S. Provisional Application No. 61/583,841, filed Jan. 6, 2012; and is a continuation of U.S. application Ser. No. 13/734,986, filed Jan. 6, 2013.

BACKGROUND

Field

This invention is generally related to semiconductor fabrication methods, and more particularly to a method for fabricating diamond semiconductors.

Background

Diamond possesses favorable theoretical semiconductor performance characteristics. However, practical diamond based semiconductor device applications remain limited. One issue that has limited the development of practical diamond based semiconductors is the difficulty of fabricating quality n-type layers in diamonds. While attempts have been made to improve n-type diamond fabrication based on limiting the concentration of vacancy created defects, the difficulties associated with fabricating quality n-type layers in diamond has yet to be sufficiently resolved. Deficiencies in known diamond fabrication technology include those related to formation of high power circuit elements for monolithic system level integration. Therefore, there is a need for a new and improved system and method for fabricating diamond semiconductors, including n-type layers within diamond semiconductors for high power circuit elements for monolithic system level integration.

SUMMARY

Disclosed herein is a new and improved system and method for fabricating diamond semiconductors. In accordance with one aspect of the approach, a method of fabricating monolithically integrated diamond semiconductor. The method may include the steps of seeding the surface of a substrate material, forming a diamond layer upon the surface of the substrate material; and forming a semiconductor layer within the diamond layer, wherein the diamond semiconductor of the semiconductor layer has n-type donor atoms and a diamond lattice, wherein at least 0.16% of the donor atoms contribute conduction electrons with mobility greater than 770 $cm^2/Vs$ to the diamond lattice at 100 kPa and 300K.

Other systems, methods, aspects, features, embodiments and advantages of the system and method for fabricating diamond semiconductors disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the system disclosed herein. In the figures, like reference numerals designate corresponding parts throughout the different views.

FIG. 1 is a block diagram of a first embodiment of the method for fabricating diamond semiconductors.

FIG. 5A and FIG. 5B are a block diagram of a third embodiment of the method for fabricating diamond semiconductors.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

FIG. 1 shows a block diagram of a first embodiment of the method 100 for fabricating layers within diamond material. The method 100 may include a first step 102 of selecting a diamond material having a diamond lattice structure. The diamond material is intrinsic diamond. Intrinsic diamond is diamond that has not been intentionally doped. Doping may introduce impurities for the purpose of giving the diamond material electrical characteristics, such as, but not limited to, n-type characteristics and p-type characteristics. The diamond material may be a single crystal or polycrystalline diamond.

Figure 2A:
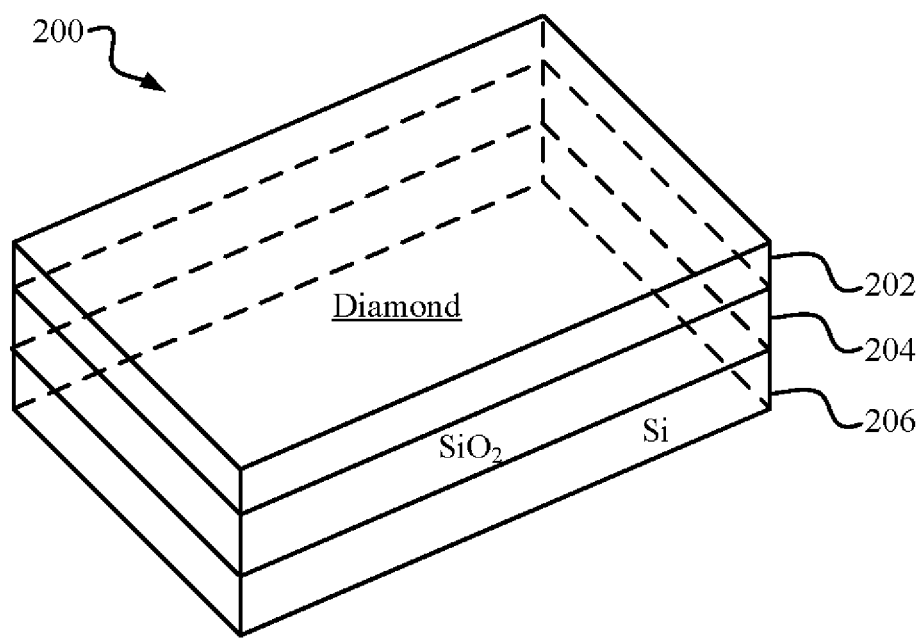
FIG. 2A is a perspective view of a prior art model of an intrinsic diamond thin film wafer upon which the method of FIG. 1 may be practiced.

FIG. 2A is a perspective view of a model of an intrinsic diamond thin film wafer 200. Though not limited to any particular diamond material, in one embodiment, the diamond material of method 100 is the intrinsic diamond thin film wafer 200. The intrinsic diamond thin film wafer 200 may include a diamond layer 202, a silicon dioxide layer ($SiO_2$) 204, and a silicon wafer layer 206. Diamond layer 202 may be, but is not limited to, ultrananocrystalline diamond. The intrinsic diamond thin film wafer 200 may be 100 mm in diameter. The diamond layer 202 may be a 1 μm polycrystalline diamond having a grain size of approximately 200-300 nm. The silicon dioxide layer ($SiO_2$) 204 may be approximately 1 μm. The silicon wafer layer 206 may be approximately 500 μm Si, such as Aqua 100 available from Advanced Diamond Technologies, Inc. The first step 102 of method 100 may include selecting a variety of diamond base materials such as, but not limited to, the exemplary diamond layer 202 of intrinsic diamond thin film wafer 200.

Figure 2B:
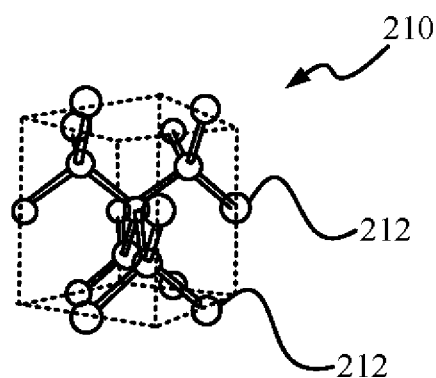
FIG. 2B is a prior art model of an intrinsic diamond lattice structure of the diamond of FIG. 2A.

FIG. 2B is a model of an intrinsic diamond lattice structure 210, such as, but not limited to, an intrinsic diamond lattice structure of diamond layer 202. The intrinsic diamond lattice structure 210 may include a plurality of carbon atoms 212. The intrinsic diamond lattice structure 210 is known to those having skill in the art. In the model, the intrinsic diamond lattice structure 210 is shown defect free and all of the atoms shown are carbon atoms 212.

The second step 104 of method 100 may include introducing a minimal amount of acceptor dopant atoms to the diamond lattice to create ion tracks. The creation of the ion tracks may include creation of a non-critical concentration of vacancies, for example, less than $10^{22}/cm^3$ for single crystal bulk volume, and a diminution of the resistive pressure capability of the diamond layer 202. For example, second step 104 may include introducing the acceptor dopant atoms using ion implantation at approximately 293 to 298 degrees Kelvin (K) in a low concentration. The acceptor dopant atoms may be p-type acceptor dopant atoms. The p-type dopant may be, but is not limited to, boron, hydrogen and lithium. The minimal amount of acceptor dopant atoms may be such that carbon dangling bonds will interact with the acceptor dopant atoms, but an acceptor level is not formed in the diamond lattice.

The minimal amount of acceptor dopant atoms of second step 104 may be for example, but is not limited to, approximately $1 \times 10^{10}/cm^3$ of boron. In other embodiments, the minimal amount of acceptor dopant atoms of second step 104 may be for example, but is not limited to, approximately $5 \times 10^{10}/cm^3$ of boron and a range of $1 \times 10^8/cm^3$ to $5 \times 10^{10}/cm^3$. Second step 104 may be accomplished by boron co-doping at room temperature in that created vacancies may be mobile, but boron may take interstitial positioning. The second step 104 may create mobile vacancies for subsequent dopants, in addition to some substitutional positioning.

The ion tracks of second step 104 may be viewed as a ballistic pathway for introduction of larger substitutional dopant atoms (see third step 106 below). Second step 104 may also eliminate the repulsive force (with respect to the substitutional dopant atoms (see step 106 below)) of the carbon dangling bonds in the diamond lattice by energetically favoring interstitial positioning of the acceptor dopant atoms, and altering the local formation energy dynamics of the diamond lattice.

The third step 106 of method 100 may include introducing the substitutional dopant atoms to the diamond lattice through the ion tracks. For example, third step 106 may include introducing the larger substitutional dopant atoms using ion implantation preferably at or below approximately 78 degrees K for energy implantation at less than 500 keV. Implanting below 78 degrees K may allow for the freezing of vacancies and interstitials in the diamond lattice, while maximizing substitutional implantation for the substitutional dopant atoms. The larger substitutional dopant atoms may be for example, but is not limited to, phosphorous, nitrogen, sulfur and oxygen.

For implantation where the desired ion energy is higher, as local self-annealing may occur, it may be beneficial to use ambient temperature in conjunction with MeV energy implantation. Where the desired ion energy is higher, there may be a higher probability of an incoming ion taking substitutional positioning.

The larger substitutional dopant atoms may be introduced at a much higher concentration than the acceptor dopant atoms. The higher concentration of the larger substitutional dopant atoms may be, but is not limited to, approximately $9.9 \times 10^{17}/cm^3$ of phosphorous and a range of $8 \times 10^{17}$ to $2 \times 10^{18}/cm^3$.

In third step 106, the existence of the ballistic pathway and minimization of negative repulsive forces acting on the substitutional dopant atoms facilitates the entry of the substitutional dopant atoms into the diamond lattice with minimal additional lattice distortion. Ion implantation of the substitutional dopant atoms at or below approximately 78 degrees K provides better impurity positioning, favoring substitutional positioning over interstitial positioning, and also serves to minimize the diamond lattice distortions because fewer vacancies are created per impinging ion.

In one embodiment, ion implantation of step 106 may be performed at 140 keV, at a 6 degree offset to minimize channeling. Implant beam energy may be such that dosages overlap in an active implant area approximately 25 nm below the surface so that graphitic lattice relaxation is energetically unfavorable. Doping may be performed on a Varian Ion Implantation System with a phosphorus mass 31 singly ionized dopant (i.e., 31P+); a beam current of 0.8 μA; a beam energy of 140 keV; a beam dose $9.4 \times 10^{11}/cm^2$; an incident angle of 6 degrees; and at a temperature of at or below approximately 78 degrees K.

The fourth step 108 of method 100 may include subjecting the diamond lattice to rapid thermal annealing. The rapid thermal annealing may be done at 1000 degree celsius C. Rapid thermal annealing may restore portions of the diamond lattice that may have been damaged during the second step 104 and the third step 106 and may electrically activate the remaining dopant atoms that may not already be substitutionaly positioned. Higher temperatures at shorter time durations may be more beneficial than low temperature, longer duration anneals, as the damage recovery mechanism may shift during long anneal times at temperatures in excess of 600 C.

Figure 3A:
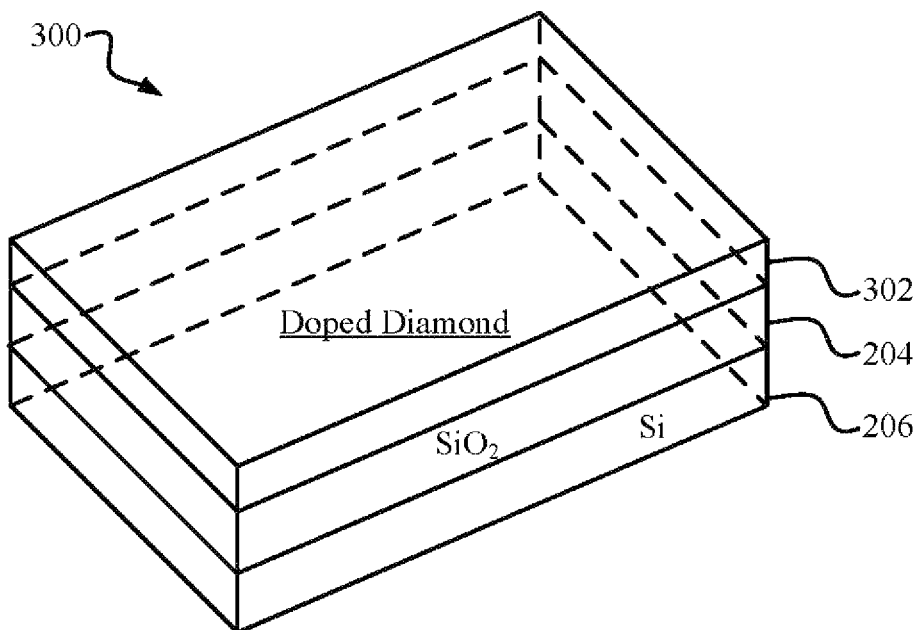
FIG. 3A is a perspective view of an exemplary model of a doped diamond thin film wafer such as may be fabricated by practicing the method of FIG. 1 upon the intrinsic diamond thin film wafer of FIG. 2.

FIG. 3A is a perspective view of a model of a doped diamond thin film wafer 300, such as may be fabricated by subjecting the intrinsic diamond thin film wafer 200 to method 100. The doped diamond thin film wafer 300 may include a doped diamond layer 302, the silicon dioxide layer ($SiO_2$) 204, and the silicon wafer layer 206.

Figure 3B:
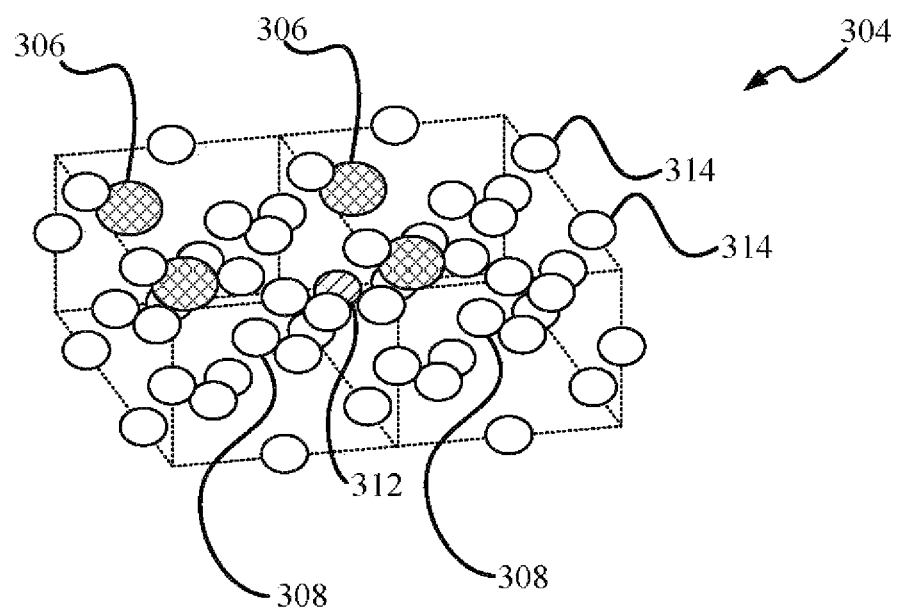
FIG. 3B is a model of a doped diamond lattice structure of the doped diamond thin film wafer of FIG. 3A.

FIG. 3B is a model of a doped diamond lattice structure 304, such as may be the result of subjecting the diamond layer 202 to method 100. The doped diamond lattice structure 304 may include a plurality of carbon atoms 314, a plurality of phosphorus atoms 306, and a plurality of vacancies 308, and a boron atom 312.

The method 100 allows for the fabrication of a semiconductor system including a diamond material, such as, but not limited to, the doped diamond thin film wafer 300, having n-type donor atoms, such as, but not limited to, the plurality of phosphorus atoms 306, and a diamond lattice, such as, but not limited to, the doped diamond lattice structure 304, wherein, for example by way of shallow ionization energy, approximately 0.25 eV, 0.16% of the donor atoms contribute conduction electrons with mobility greater than 770 cm2/Vs to the diamond lattice at 100 kPa and 300K.

Figure 4:
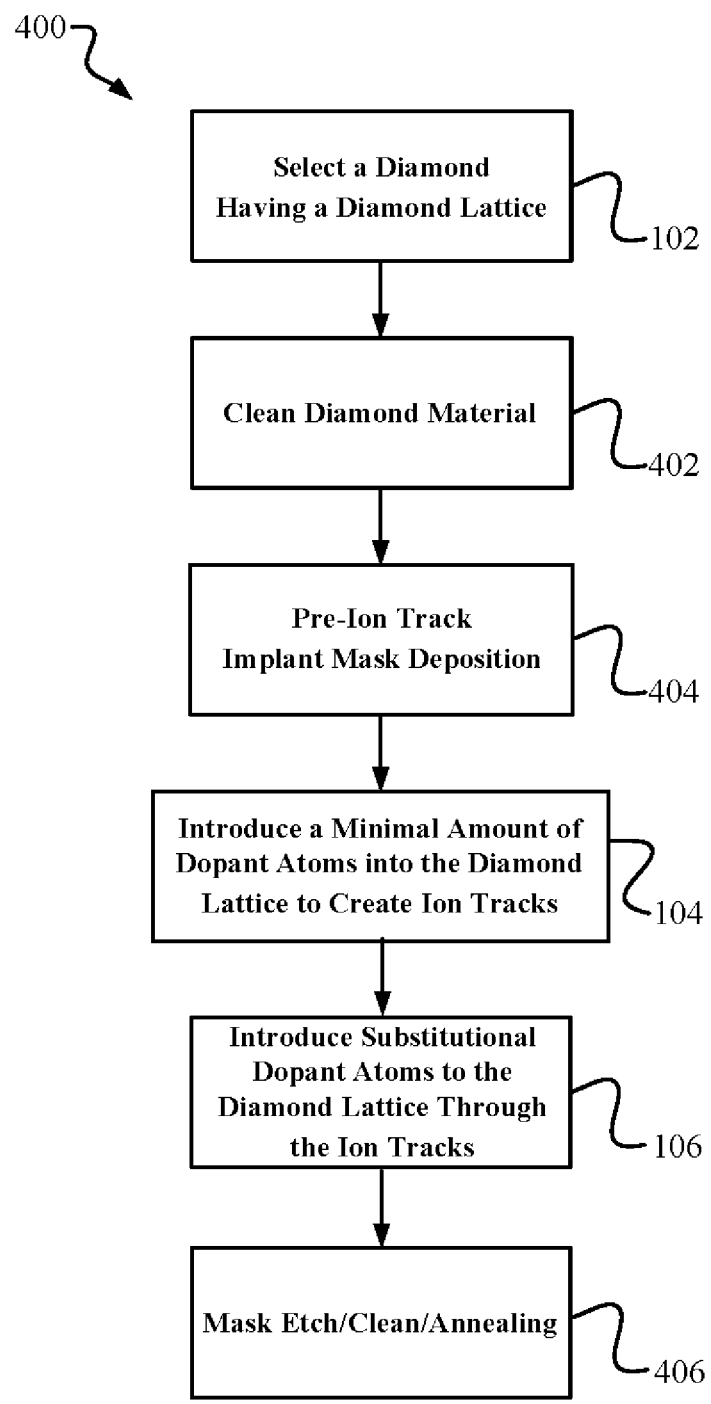
FIG. 4 is a block diagram of a second embodiment of the method for fabricating diamond semiconductors.

FIG. 4 shows a block diagram of a second embodiment of the method 400 for fabricating layers within diamond material. The first step of method 400 may be the same as the first step 102 of method 100, which includes selecting a diamond material having a diamond lattice structure.

The second step 402 of method 400 may include cleaning the diamond material to remove surface contaminants. For example, second step 402 may include cleaning the intrinsic diamond thin film wafer 200 (see FIG. 2). The cleaning may be a strong clean, for example but not limited to, a standard diffusion clean, known to those having skill in the art. One example, of such a diffusion clean includes: applying a 4:1 solution of $H_2SO_4/H_2O_2$ for 10 minutes; applying a solution of $H_2O_2$ for 2.5 minutes; applying a 5:1:1 solution of $H_2O/H_2O_2/HCL$ for 10 minutes; applying a solution of $H_2O_2$ for 2.5 minutes; and heat spin drying for 5 minutes.

The third step 404 of method 400 may include subjecting the diamond material to a pre-ion track mask deposition over a first portion of the diamond lattice. The pre-ion track mask may protect a first portion of the diamond material during ion implantation. The pre-ion track mask deposition may be an aluminum pre-implant mask deposition. The pre-ion track mask deposition may be performed using a Gryphon Metal Sputter System using aluminum of 99.99999% (6N) purity, with a deposition time of 21-24 seconds, at a power of 7.5 kW, a pressure: $2.5 \times 10^{-3}$ Torr; and to a thickness of 30 nm.

The fourth step of method 400 may be the same as the second step 104 of method 100, which includes introducing a minimal amount of acceptor dopant atoms to the diamond lattice to create ion tracks.

The fifth step of method 400 may be the same as the third step 106 of method 100, which includes introducing the substitutional dopant atoms to the diamond lattice through the ion tracks.

The sixth step 406 of method 400 may include mask etching, cleaning, and annealing the diamond lattice. The mask etching may be an aluminum mask etch. The mask etching may be a wet etch using aluminum etchant, for example, a Cyantek AL-11 Aluminum etchant mixture or an etchant having a composition of 72% phosphoric acid; 3% acetic acid; 3% nitric acid; 12% water; and 10% surfactant, at a rate of 1 μm per minute. After the aluminum is removed visually, which may take approximately 30 seconds, the wafers may be run under de-ionized water for sixty seconds and dried via pressurized air gun.

In other embodiments, the mask etching of the sixth step 406 may be a blanket etch using reactive ion etching (Ar (35 SCCM)/$O_2$ (10 SCCM), at $V_{BIAS}$ 576 V, 250 W Power, under pressure of 50 mTorr, for a total etch thickness of 25 nm. The Ar/$O_2$ etch may have a dual function of both etching and polishing/terminating the diamond material surface. In addition to initial etching, the same process recipe is later implemented to form device architecture, and define different active and inactive areas of the diamond, as per required by end application use (i.e., MOSFET, diode, LED, etc.). Etch masking layer, for example a 200 nm thick aluminum deposition, may be formed via standard E-beam evaporation. Etching may be performed on an Oxford System 100 Plasmalab Equipment (Oxford Deep Reactive Ion Etcher). The etching conditions may be: RIE Power: 200 W; ICP power: 2000 W; Pressure: 9 mTorr; $O_2$ flow: 50 sccm; Ar flow: 1 sccm. The etching rates may be 155 nm/min for the diamond layer and 34 nm/min for the aluminum masking layer.

The cleaning of sixth step 406 may be similar to diffusion clean described in the second step 402. The annealing of sixth step 406 may be a rapid thermal annealing to approximately 1000-1150 degrees Celsius under flowing $N_2$ for approximately 5 minutes and/or the rapid thermal annealing may be performed with an Agilent RTA model AG4108 operating under the settings shown in Table 1.

TABLE 1

| Command | Time(s)/Intensity (%) | Temperature | Gas Flow |
| --- | --- | --- | --- |
| Delay | 20_s | N/A | 10 SLPM $N_2$ |
| Delay | 5 s | N/A | 7 SLPM $N_2$ |
| Inin | 8% | 25° C. | 4 SLPM $N_2$ |
| Ramp | 10 s | 650° C. | 4 SLPM $N_2$ |
| Steady | 15 s | 650° C. | 4 SLPM $N_2$ |
| Ramp | 10 s | 900° C. | 4 SLPM $N_2$ |
| Steady | 55 s | 950° C. | 4 SLPM $N_2$ |
| Ramp | 30 s | 650° C. | 7 SLPM $N_2$ |
| Delay | 15 s | N/A | 7 SLPM $N_2$ |

The sixth step 406 of method 400 may include subjecting the diamond material to a pre-substitutional mask deposition over a portion of the diamond lattice. The pre-substitutional mask deposition may be an aluminum pre-implant mask deposition. The pre-substitutional mask deposition may be performed using a Gryphon Metal Sputter System using aluminum of 99.99999% (6N) purity, with a deposition time of 21-24 seconds, at a power of 7.5 kW, a pressure: $2.5 \times 10^{-3}$ Torr; and to a thickness of 30 nm.

For some applications, it may be beneficial to differentially dope different parts of the same diamond wafer, for example, to create p-type and n-type regions. In embodiments, various semiconductor devices are created including P-N junctions and P-i-N junctions.

Figure 5B:
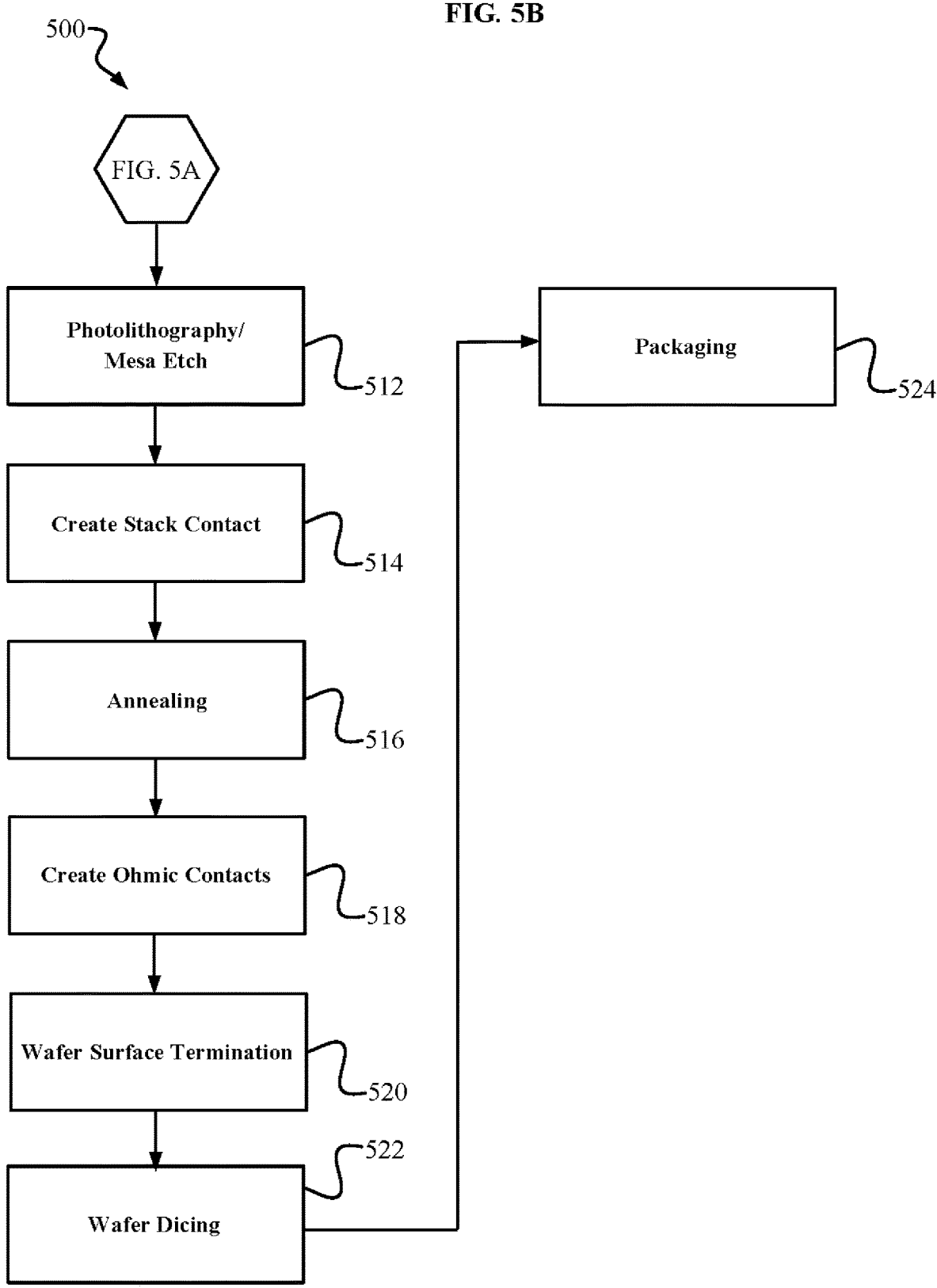

FIG. 5A and FIG. 5B show a block diagram of a third embodiment of the method 500 for fabricating layers within diamond material. Method 500 provides a process for fabricating n-type layers within diamond semiconductors for a $P^+$-i-N diode. The first step of method 500 may be the same as the first step 102 of method 100, which includes selecting a diamond material having a diamond lattice structure.

Figure 6:
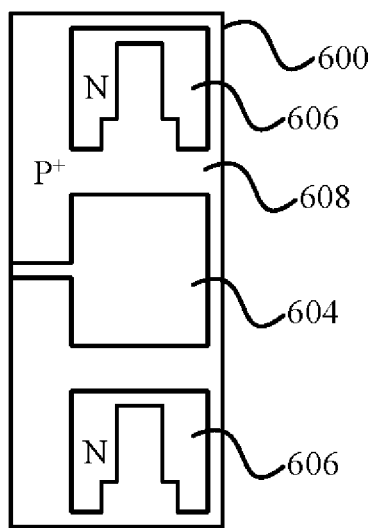
FIG. 6 is a top view of an exemplary $P^+$-i-N diode model that may be fabricated according to the method of FIG. 5A and FIG. 5B.

FIG. 6 shows a top view of an exemplary model of a $P^+$-i-N diode 600 that may be fabricated according to method 500. $P^+$-i-N diode 600 may include a lightly doped semiconductor region (i) (for example, see FIG. 8, 804), between a $p^+$-type semiconductor region 608, and an n-type semiconductor region 606. The method of 500 with SRIM, Stopping and Range of Ions in Matter, modeling provides a path for fabricating $P^+$-i-N diodes that approach theoretical projections. In one embodiment, the $P^+$-i-N diode 600 may include the lightly doped semiconductor region (i) 804 of a depth of approximately 10 nm, between a p-type semiconductor (for example, see FIG. 8, 806) of a depth of approximately 150 nm, the $p^+$-type semiconductor region 608 of a depth of approximately 100 nm, and the n-type semiconductor region 606 of a depth of approximately 100 nm. FIG. 6 also shows a metallic contact/bonding pad 604 for connecting to the $p^+$-type semiconductor region 608.

The second step of method 500 may be the same as the second step 402 of method 400, including cleaning the diamond material to remove surface contaminants.

The third step 502 of method 500 may include subjecting the diamond material to a pre-$P^+$ mask deposition over a non-$P^+$ portion of the diamond lattice. The pre-$P^+$ mask deposition may protect a non-$P^+$ portion of the diamond material during $P^+$ ion implantation. The pre-$P^+$ mask deposition may be an aluminum pre-implant mask deposition. The pre-ion track mask deposition may be performed using a Gryphon Metal Sputter System using aluminum of 99.99999% (6N) purity, with a deposition time of 21-24 seconds, at a power of 7.5 kW, a pressure: $2.5\times10^{-3}$ Torr; and to a thickness of 30 nm.

The fourth step 504 of method 500 may include a $P^+$ layer implant of the diamond material. The $P^+$ layer implant may be performed with a dopant of $11B^+$, at a beam current of 0.04 µA, at a beam energy of 55 keV, with a beam dose of $1\times10^{20}$ atoms/cm$^2$, at an incident angle of 6 degrees, and at or below approximately 78 degrees K, to create a $P^+$ layer of 100 nm.

The fifth step of method 500 may be the same as the sixth step 406 of method 400, including mask etching, cleaning, and annealing the diamond material.

The sixth step 506 of method 500 may include subjecting the diamond material to a pre-P mask deposition over a non-P portion of the diamond lattice. The pre-P mask deposition may protect a non-P portion of the diamond material during P ion implantation. The pre-P mask deposition may be an aluminum pre-implant mask deposition. The pre-P mask deposition may be performed using a Gryphon Metal Sputter System using aluminum of 99.99999% (6N) purity, with a deposition time of 21-24 seconds, at a power of 7.5 kW, a pressure: $2.5\times10^{-3}$ Torr; and to a thickness of 30 nm.

The seventh step 508 of method 500 may include a P layer implant of the diamond material. The P layer implant may be performed with a dopant of 11B+, at a beam current of 0.04 µA, at a beam energy of 55 keV, with a beam dose of $3\times10^{17}$ atoms/cm$^2$, at an incident angle of 6 degrees, and at or below approximately 78 degrees K, to create a P layer of 150 nm.

The eighth step of method 500 may be the same as the sixth step 406 of method 400, including mask etching, cleaning, and annealing the diamond material.

The ninth step of method 500 may be the same as the third step 404 of method 400, including subjecting the diamond material to a pre-ion track mask deposition over a first portion of the diamond lattice.

The tenth step of method 500 may be the same as the second step 104 of method 100, which includes introducing a minimal amount of acceptor dopant atoms to the diamond lattice to create ion tracks.

The eleventh step of method 500 may be the same as the third step 106 of method 100, which includes introducing substitutional dopant atoms to the diamond lattice through the ion tracks.

The twelfth step of method 500 may be same as the sixth step 406 of method 400, including mask etching, cleaning, and annealing the diamond material.

The thirteenth step 510 of method 500 may include a blanket etch. The thirteenth step 510 may include a blanket etch in which the surface layer, approximately 25 nm, of the diamond layer 202 is etched off to remove any surface graphitization.

The fourteenth step 512 of method 500 may include a photolithography/mesa etch to obtain a diamond stack structure, such as that shown in FIG. 6. The fourteenth step 512 may include a diffusion clean and photolithography prior to the mesa etch.

The fifteenth step 514 of method 500 may include a creating a contact for the top of the stack. Contact to the top of the stack may be achieved by evaporating ITO with 5N purity to a thickness of 200 nm onto the stack through a shadow mask and then performing a liftoff.

The sixteenth step 516 of method 500 may include annealing. The annealing of step 516 may be oven annealing at 420 degrees C. in Ar ambient until ITO transparency is attained, which may be in approximately 2.5 hours.

The seventeenth step 518 of method 500 may include creating Ohmic contacts. The Ohmic contacts may include contacts to the $P^+$ layer, for example, the metallic contact/bonding pad 604, and the n-layer. As wire bonding may be difficult with a small contact area, Ti and Au layers may be evaporated through a shadow mask using photolithography. Ti may also function as a diffusion barrier between ITO and Au layers. A contact layer thickness of 30 nm may be created for the $P^+$ layer. A contact layer thickness of 200 nm may be created for the N-layer. In one embodiment, the diamond cap layer may be removed to expose the newly formed n-type layer to form an electrical contact for device use. The step may include polishing the diamond layer while etching, thus minimizing the surface roughness, and electrically terminating (oxygen) the surface of the diamond, a step in semiconductor device fabrication. In some embodiments, there is a further step of forming metal contacts on the diamond so that the diamond may function as a component part of an electronic device. The seventeenth step 518 of method 500 may include a metal furnace annealing. The metal furnace annealing may be performed at 420 degrees celsius for two hours.

The eighteenth step 520 of method 500 may include wafer surface termination. The nineteenth step 522 of method 500 may include wafer surface dicing. The twentieth step 524 of method 500 may include packaging. In the twentieth step 524, portions of the diamond material may be diced, mounted, wire bound and encapsulated in transparent silicone sealant to create 6-pin surface mount device packages.

Figure 7:
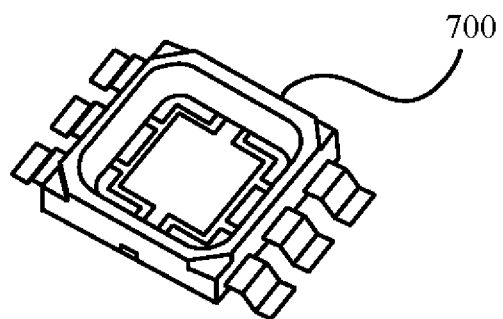
FIG. 7 is a perspective view of a model of an exemplary six-pin surface mount device package that may be fabricated according to the method of FIG. 5A and FIG. 5B.

FIG. 7 shows a perspective view of a model of an exemplary six-pin surface mount device package 700 that may be fabricated according to the method of FIG. 5A and FIG. 5B.

The methods disclosed herein may allow for the creation of a number of electrical diamond junctions to serve functions traditionally served by silicon semiconductors. While the application discusses examples in the context of a bipolar diode, those having skill in the art will recognize that the present techniques describe novel genuine n-type diamond material and novel p-type diamond material that may be used in multiple variations of electrical devices and monolithically formed combinations of the variations, including FETs and other switches, digital and analog, and light emitting bodies, and are not limited to the specific implementations shown herein. The various preferred embodiments need not necessarily be separate from each other and can be combined.

Figure 8:
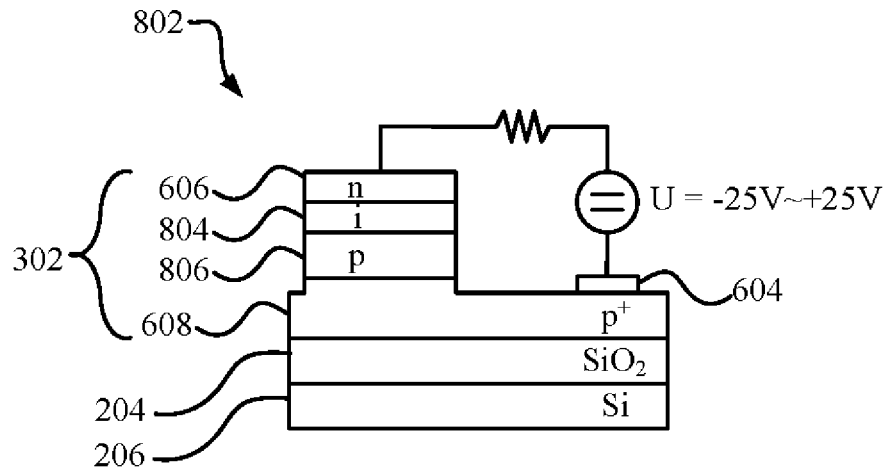
FIG. 8 shows a schematic diagram of a diode test condition setup, such as may be employed with the diode model of FIG. 6.

FIG. 8 shows a schematic diagram of a $P^+$-i-N diode test condition setup 802. A $P^+$-i-N diode, such as a $P^+$-i-N diode 600 fabricated according to method 500, may be tested according to the $P^+$-i-N diode test condition setup 802.

Figure 9:
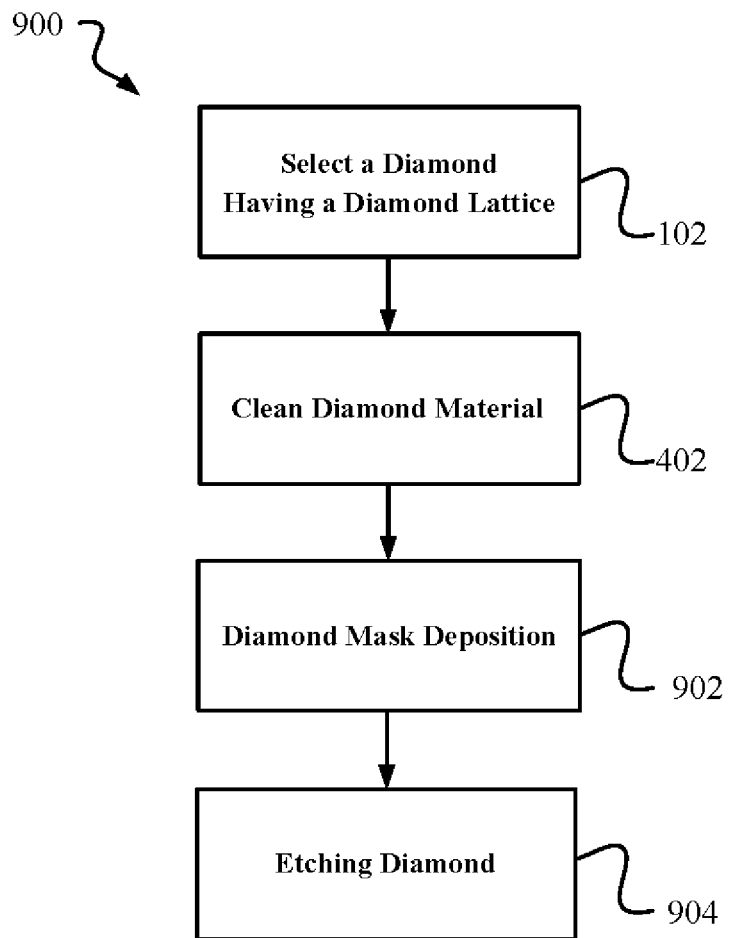
FIG. 9 is a graphical illustration of the threshold voltage performance characteristics of a diode that may be fabricated according to the method of FIG. 5A and FIG. 5B.

FIG. 9 shows a block diagram of an embodiment of a method 900 for etching diamond material. Impurities in the diamond layer 202 may effect the uniformity, rate of the etching, and chemical reactivity. Inductive coupled plasma RIE (ICP-RIE) may allow for polished diamond surfaces with lithographic patterning required for semiconductor devices and electronic isolation of exposed etched areas. ICP-RIE may result in reduced process time and reduce the complexity of the semiconductor process line.

The first step of method 900 may be the same as the first step 102 of method 100, which includes selecting a diamond material having a diamond lattice structure. The second step of method 900 may be the same as the second step 402 of method 400, which includes cleaning the diamond material to remove surface contaminants.

The third step 902 of method 900 may include mask deposition. The mask deposition may include the application of a patterned or uniformly deposited mask comprised of photoresist or metallic elements such as, but not limited to, aluminum. Aluminum may provide desirous properties as etch activity of the diamond material may be equal or better than 5.8 times the aluminum layer.

The fourth step 904 of method 900 may include mask etching. Etching may be performed on a number of systems, such as but not limited to Oxford systems. Etching may be performed using an Oxford System 100 Plasmalab Equipment (Oxford Deep Reactive Ion Etcher). The etching conditions may be: RIE Power: 200 W; ICP power: 2000 W; Pressure: 9 mTorr; $O_2$ flow: 50 sccm; Ar flow: 1 sccm. The etching rates may be 620 nm/min.

In other embodiments, for example embodiments that may be used for removing diamond surface graphitization, such as carbon dangling bonds, etching conditions may be: RIE Power: 150 W and ICP power: 250 W, for etching rates of approximately 60 nm/min. The duration of the etch may be confirmed by visual characterization of surface features through optical micrograph. In some embodiments, the etching duration for nanocrystalline and microcrystalline film may be 20 seconds.

Figure 10:
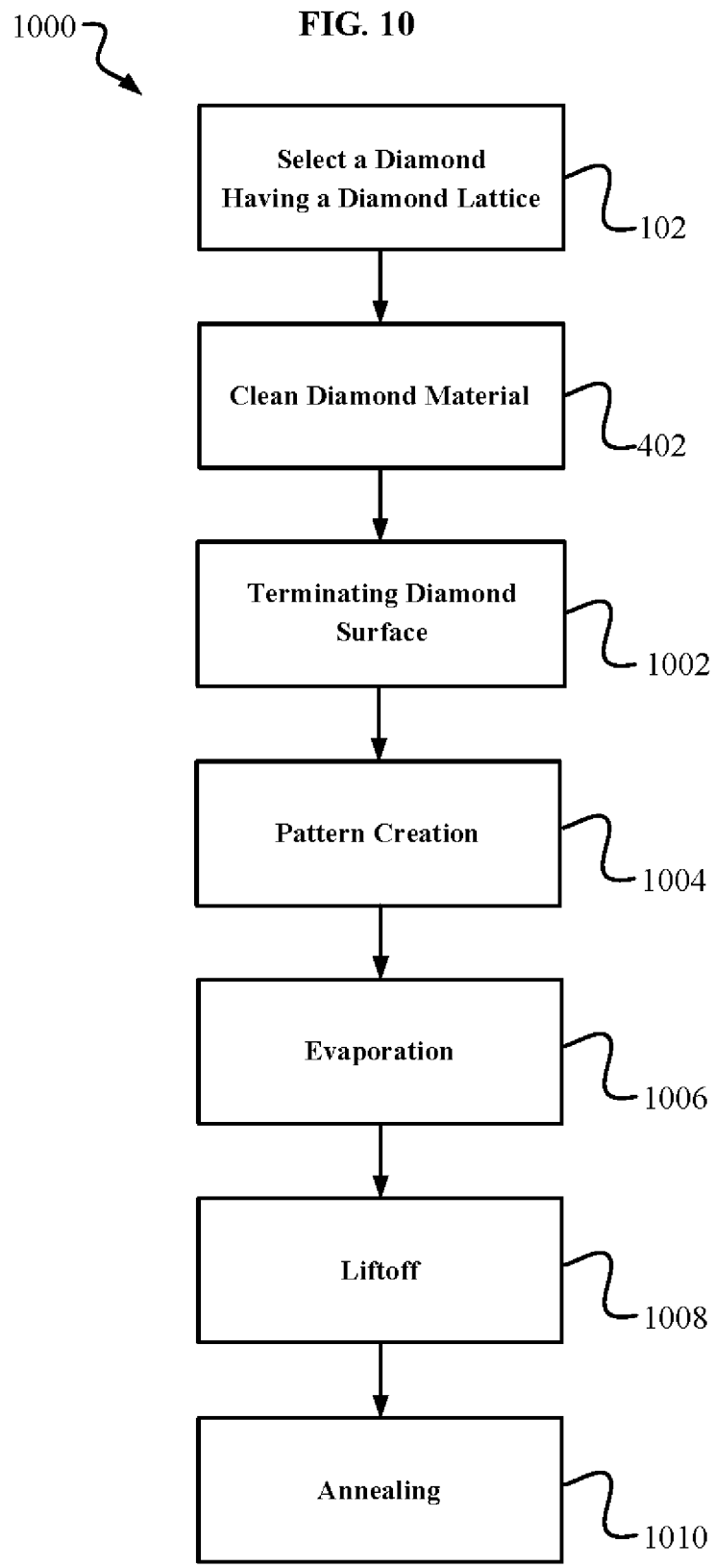
FIG. 10 shows a block diagram of an embodiment of a method for forming Ohmic contacts to diamond material.

FIG. 10 shows a block diagram of an embodiment of a method 1000 for forming Ohmic contacts to diamond material. The first step of method 1000 may be the same as the first step 102 of method 100, which includes selecting a diamond material having a diamond lattice structure. In some embodiments, the diamond material may be formed upon a metal substrate, such as, but not limited to, tungsten. In some embodiments, the diamond material of step 102 may include a diamond band gap. The second step of method 1000 may be the same as the second step 402 of method 400, which includes cleaning the diamond material to remove surface contaminants.

The third step 1002 of method 1000 may include terminating the diamond surface. Terminating the diamond surface may include electrically isolating the diamond surface through methods such as, but not limited to, hydrogen termination and oxygen termination, in order to pin the surface states.

The fourth step 1004 of method 1000 may include creating a pattern on the diamond surface. Creating a pattern on the diamond surface may include lithography techniques such as but not limited to photoresist and other masking techniques.

The fifth step 1006 of method 1000 may include performing evaporation techniques. Evaporation techniques may include forming circuit element configurations by evaporating contact metals upon the diamond surface.

The contact metal selected may be based upon the relative band gap positioning or work function requirements. The metal may be selected to maximize the operation of the desired device based upon a comparison of the relative Fermi positioning of the metal ahead of contact with the diamond surface, and the band structure of the proposed contact, such as for Ohmic or Schottky contact. In some embodiments, the metal may be comprised of gold, silver, aluminum, palladium, copper, tungsten, titanium, and polysilicon. In some embodiments, the metal may a transparent metal, such as but not limited to, indium-tin-oxide and fluorine-tin-oxide. In the case of transparent metals alloyed with single metal gold, a titanium layer may be deposited before the gold layer, where titanium may act as a diffusion barrier.

In some embodiments, such as those in requiring greater bond strength, such as wire bonding, performing evaporation techniques may include applying a metal carbide interfacial metal between the diamond surface and other contact metal, such as but not limited to, titanium, silicon, and tin.

The sixth step 1008 of method 1000 may include performing liftoff techniques. Liftoff techniques may include stripping the diamond surface of the masking material.

The seventh step 1010 of method 1000 may include annealing. The annealing of step 1010 may be oven annealing at 350 degrees C. for greater than 45 minutes per 300 nm thickness under flowing nitrogen gas.

Figure 11:
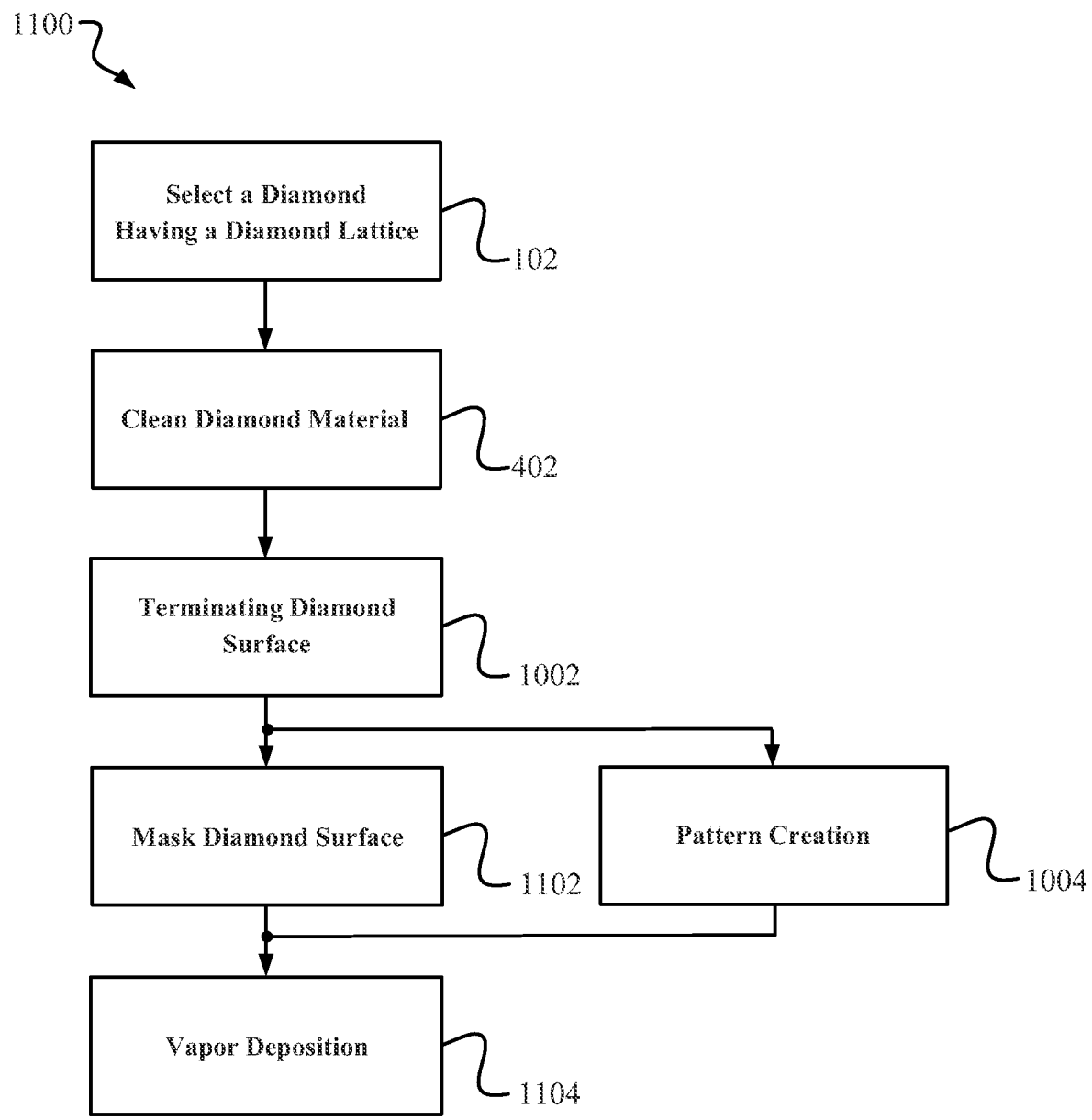
FIG. 11 shows a block diagram of an embodiment of a method for forming Schottky type contacts to diamond material.

FIG. 11 shows a block diagram of an embodiment of a method 1100 for forming Schottky type contacts to diamond material. The first step of method 1100 may be the same as the first step 102 of method 100, which includes selecting a diamond material having a diamond lattice structure. The second step of method 1100 may be the same as the second step 402 of method 400, which includes cleaning the diamond material to remove surface contaminants. The third step of method 1100 may be the same as the third step 1002 of method 1000, which includes terminating the diamond surface.

The fourth step 1102 of method 1100 may include masking the diamond surface. Masking the diamond surface may include placing a shadow mask upon the diamond surface. In some embodiments, mask the diamond surface may be accomplished in the same manner as the fourth step 1004 of method 1000.

The fifth step 1104 of method 1100 may include a vapor deposition of metal upon the diamond surface. The fifth step may be performed using a sputtering tool known to those having skill in the art.

Additional embodiments of methods for forming contacts to diamond surfaces may include degeneratively doping the diamond material where the band gap is minimized prior to application of the metal contact. Such alternative embodiments may provide for improved heat transfer and electron transfer characteristics. Further embodiments may include providing a dielectric material interface layer to restrict current flow.

The systems and fabrication methods described herein provide a number of new and useful technologies, including novel n-type and novel p-type diamond semiconducting materials and devices, and methods for fabricating novel n-type and novel p-type diamond semiconducting materials and devices.

The novel fabrication methods include, but are not limited to, those for creating, etching, and metalizing (Schottky and Ohmic) genuine quality n-type diamond material; creating Integrated Circuits (ICs) and device drivers from diamond based power elements.

The novel devices include, but are not limited to, n-type diamond semiconductors that are at least partially activated at room temperature—i.e., the device material has sufficient carrier concentration to activate and participate in conduction; n-type diamond with high electron mobility; n-type diamond which has both high carrier mobility and high carrier concentration—without requiring a high temperature (above room temperature) or the presence of a high electrical field; an n-type diamond semiconductor with an estimated electron mobility in excess of 1,000 $cm^2$/Vs and a carrier concentration of approximately $1 \times 10^{16}$ electrons/$cm^3$ at room/ambient temperature; a bipolar diamond semiconductor device; devices with p-type and n-type regions on a single diamond wafer; diamond diode devices; bipolar diamond semiconductor devices carrying high current without necessitating either a high temperature or the presence of a strong electrical field; bipolar diamond semiconductor devices which can carry a one milliamp current while at room temperature and in the presence of a 0.28V electrical field; an n-type diamond material on polycrystalline diamond; a low cost thin film polycrystalline diamond-on-silicon carrier; diamond semiconductors on other carrier types (e.g., Fused Silica, Quartz, Sapphire, Silicon Oxide or other Oxides, etc.); a diamond power RF attenuator, a polycrystalline diamond power RF attenuator chip, a polycrystalline diamond power RF attenuator device; a diamond light emitting diode or/laser diode (LED); monolithically integrate diamond based logic drivers with high power elements (e.g., LED) on the same chip; n-type diamond material which is stable in the presence of oxygen (i.e., if a non-negligible amount of oxygen is present on the surface (such as when the wafer is on open air) the n-type semiconductor's conductivity and performance continue).

In some embodiments, this n-type and novel p-type diamond semiconducting material is constructed using polycrystalline diamond having less than a micrometer size grain and with doped thin film layers having sizes on the order of less than 900 nm. The techniques for forming said diamond material may be used on diamond films with diamond grain boundaries that are nearly atomic abrupt, such that uniformity of electrical performance may be maintained, while enabling the ability to form thin-film features from said material.

Another aspect of the invention is the ability to create metal contacts attached to the diamond semiconducting material, including the n-type material. Said metal contacts attach to the diamond material and continue to have good/ohmic conductivity (e.g., displaying high linearity). Metal contacts may refer to either or both metals (e.g., Au, Ag, Al, Ti, Pd, Pt, etc.) or transparent metals (e.g., indium tin oxide, fluoride tin oxide, etc.), as warranted by desired application use.

Figure 12:
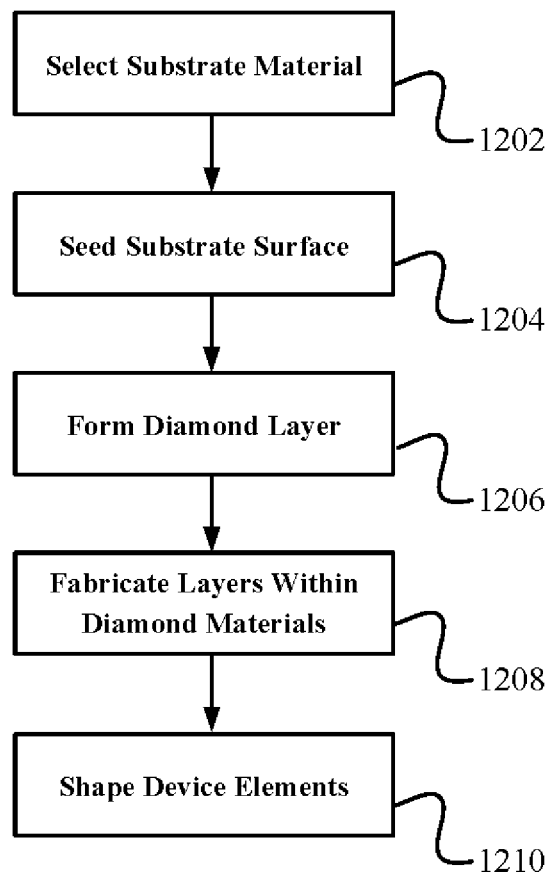
FIG. 12 is a block diagram of a method for forming monolithically integrated circuits from diamond semiconductor materials.

FIG. 12 shows a block diagram of an embodiment of a method 1200 for forming monolithically integrated circuits from diamond semiconductor materials. The method 1200 may include a first step 1202 of selecting a substrate material. The substrate material of method 1200 may include, but is not limited to, silicon oxide materials, $SiO_2$, fused silica, quartz, sapphire, gallium nitride (GaN), gallium arsenide (GaAs), and refractory metals. In addition, the substrate materials may include carbon-carbon bonding allows integration with other materials such as SiC, Graphene, Carbon Nano Tubes (CNT), as well single crystal, polycrystalline diamond materials, and combinations of the materials mentioned and other materials known to those having skill in the art. First step 1202 may form, for example, a substrate material layer 1306 (See FIG. 13).

The method 1200 may include a second step 1204 of seeding a surface of the substrate material. The substrate material may be seeded with a nanocrystalline diamond solution mixture. In one embodiment, the surface of the substrate may be ultrasonically roughened so as to facilitate a uniform and strong cohesion of growth diamond material. The seeding of the substrate material surface of second step 1204 may help form, for example and in part, a layer boundary 1308 (See FIG. 13).

The method 1200 may include a third step 1206 of forming a diamond layer upon the surface of the substrate material. The diamond layer may be formed by depositing diamond materials utilizing chemical vapor deposition (CVD) techniques such as, but not limited to, hot filament and microwave plasma. In one embodiment, the microwave plasma chemical vapor deposition (MPCVD) is utilized at low growth temperatures (i.e., less than 450 degrees C.) such that high quality crystallinity may be attained while simultaneously maintaining integration with processed substrate materials where the substrate materials may be highly temperature sensitive. Third step 1206 may form, for example, an intrinsic diamond layer 1304 (See FIG. 13).

The method 1200 may include a fourth step 1208 of forming semiconductor diamond layers. The fourth step 1208 may include fabrication steps such as those steps described in regard to methods 100 and 400. Fourth step 1208 may form, for example, a doped diamond layer 1302 (See FIG. 13).

The method 1200 may include a fifth step 1210 of forming semiconductor devices. The semiconductor devices may include, but are not limited to diodes, transistors, resistors, etc. The fifth step 1210 may include fabrication steps such as those steps described in regard to method 500.

Figure 13:
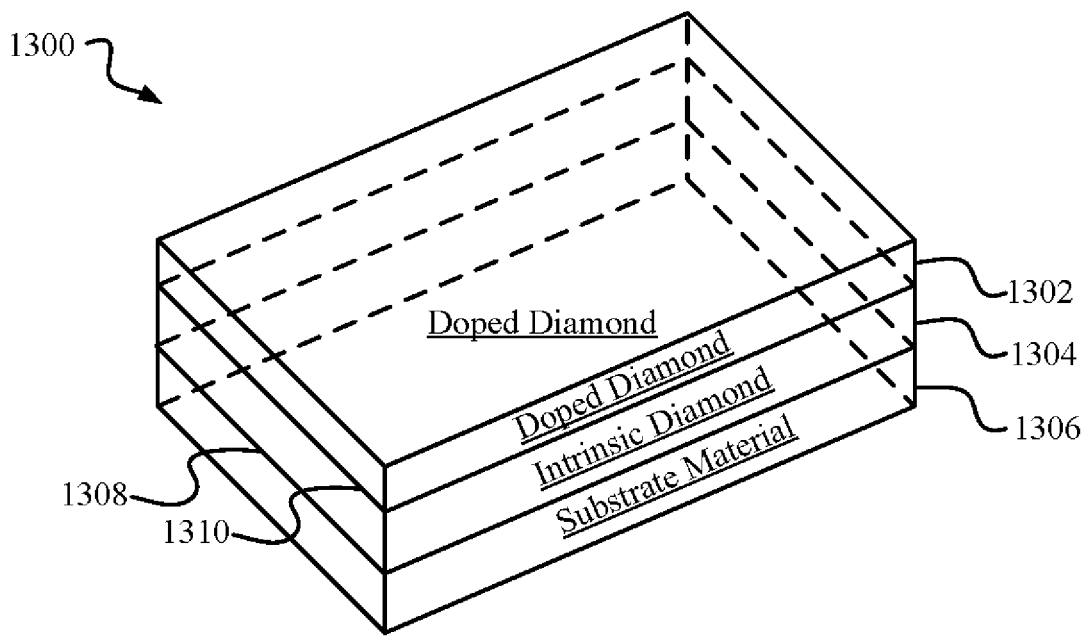
FIG. 13 is a perspective view of a model of a doped diamond thin film wafer, such as may be fabricated by according to the method of FIG. 12.

FIG. 13 is a perspective view of a model of a doped diamond thin film wafer 1300, such as may be fabricated by according to the method 1200 for forming monolithically integrated circuits from diamond semiconductor materials. The doped diamond thin film wafer 1300 may include the doped diamond layer 1302, the intrinsic diamond layer 1304, and the substrate material layer 1306. Also shown is the layer boundary 1308 and a layer boundary 1310.

A doped diamond thin film wafer fabricated according to the method 1200, such as doped diamond thin film wafer 1300, may provide beneficial thermal conductivity properties and crystal quality. For example, Raman spectra data has shown that such a diamond signature peak at 1332 $cm^{-1}$ may be substantially increased while disadvantageous graphitic conditions may be decreased around the G-Band at approximately 1575 $cm^{-1}$. These advantageous features may permit new application capabilities, such as passive diamond layers on processed silicon logic chips, in which high power heat elements may be monolithically integrated with a heat spreading diamond material layer, such as intrinsic diamond layer 1304.

Figure 14:
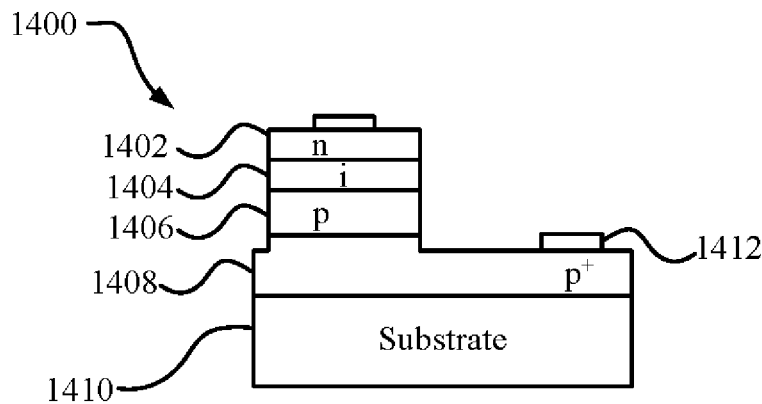
FIG. 14 is a schematic diagram of a $P^+$-i-N diode device that may be fabricated according to the method of FIG. 12.

FIG. 14 shows a schematic diagram of a $P^+$-i-N diode device 1400. A $P^+$-i-N diode device, such as a $P^+$-i-N diode device 1400, may be fabricated, in part, according to method 1200. $P^+$-i-N diode device 1400 may include a lightly doped semiconductor region (i) 1404 between a p⁺-type semiconductor region 1408, and an n-type semiconductor region 1402. FIG. 14 also shows a p-type semiconductor 1406 and a metallic contact/bonding pad 1412 for connecting to the p⁺-type semiconductor region 1408. The P⁺-i-N diode device 1400 components may be formed on a substrate 1410 base.

Devices such as P⁺-i-N diode device 1400 may be employed in devices such as, but not limited to, current controlled resistor applications such as power attenuating and signal attenuation, as well in optoelectronic applications such as sensors and LEDs where diamond materials may be used to form UV LED elements. In such LED devices, within a typical LED voltage operating range, both sufficient current density and current levels may be obtained conducive to device performance demands with desired luminous efficacy. In addition, devices such as P⁺-i-N diode device 1400 may be utilized to form device driver elements monolithically formed on sapphire substrates, where the sapphire may be formed into LED elements thereby allowing a monolithically formed LED with driver on chip beneficial to higher temperature operating environments.

Figure 15:
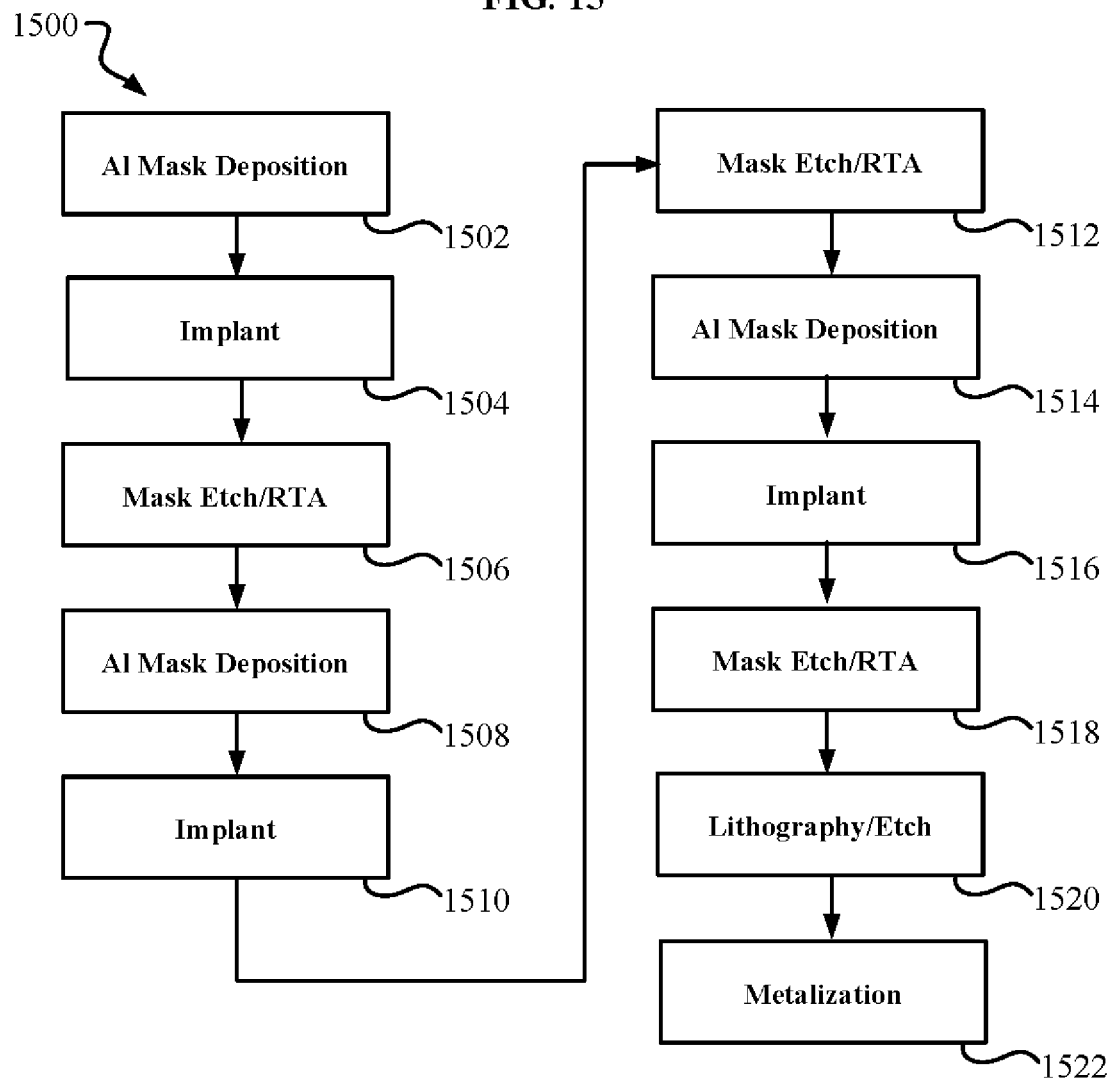
FIG. 15 is a block diagram of a method for forming monolithically integrated circuit devices from diamond semiconductor materials.

FIG. 15 shows a block diagram of an embodiment of a method 1500 for forming monolithically integrated circuit devices from diamond semiconductor materials. The steps provided in regard to method 1500 may also be employed, in part, to fabricate devices such as P⁺-i-N diode device 1400. The method 1500 may include a first step 1502 of depositing an aluminum pre-implant mask upon a diamond layer, for example, the diamond layer that may be formed after step 1208 of method 1200.

The method 1500 may include a second step 1504 of performing an implant. The method 1500 may include a third step 1506 of mask etching and annealing which may repair crystalline damage and activate the semiconductor layer, for example, the doped diamond layer 1302. The etching of method 1500 may be, for example, by the steps described in regard to method 900. The method 1500 may include a fourth step 1508 of depositing an aluminum pre-implant mask. The method 1500 may include a fifth step 1510 of performing an implant. The method 1500 may include a sixth step 1512 of mask etching and annealing which may again repair crystalline damage. The method 1500 may include a seventh step 1514 of depositing an aluminum pre-implant mask. The method 1500 may include an eighth step 1516 of performing an implant. The method 1500 may include a ninth step 1518 of mask etching and annealing which may again repair crystalline damage. The method 1500 may include a tenth step 1520 in which the desired device may be further defined through lithography and further etching. The method 1500 may include a twelfth step 1522 in which the contacts are created, for example by the steps described in regard to methods 1000 and 1100.

Figure 16:
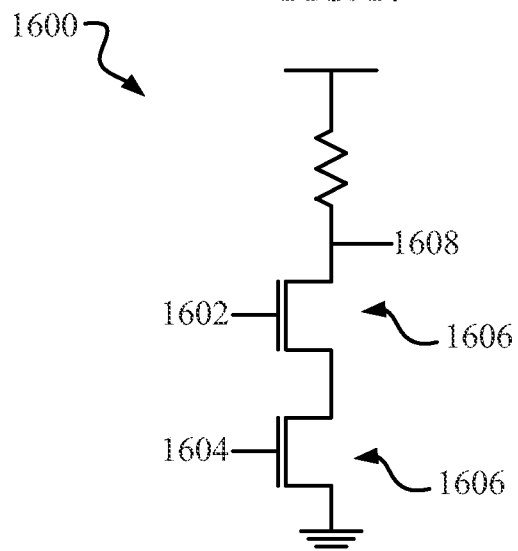
FIG. 16 is a schematic diagram of a NAND logic gate that may be formed by the methods disclosed.

FIG. 16 shows a schematic diagram of a NAND logic gate 1600 that may be formed, in part, by the methods disclosed herein. In NAND logic gate, signals 1602 and 1604 may be input into CMOS gate elements 1606 to produce a logic output at 1608. In NAND logic gate 1600, the voltage and/or current may be dynamically controlled via monolithically formed diamond element. For example, thin semiconductor diamond material may be formed via low temperature deposition on processed silicon device elements, where diamond semiconductor elements may be integrated in both passive and active circuit elements.

Figure 17:
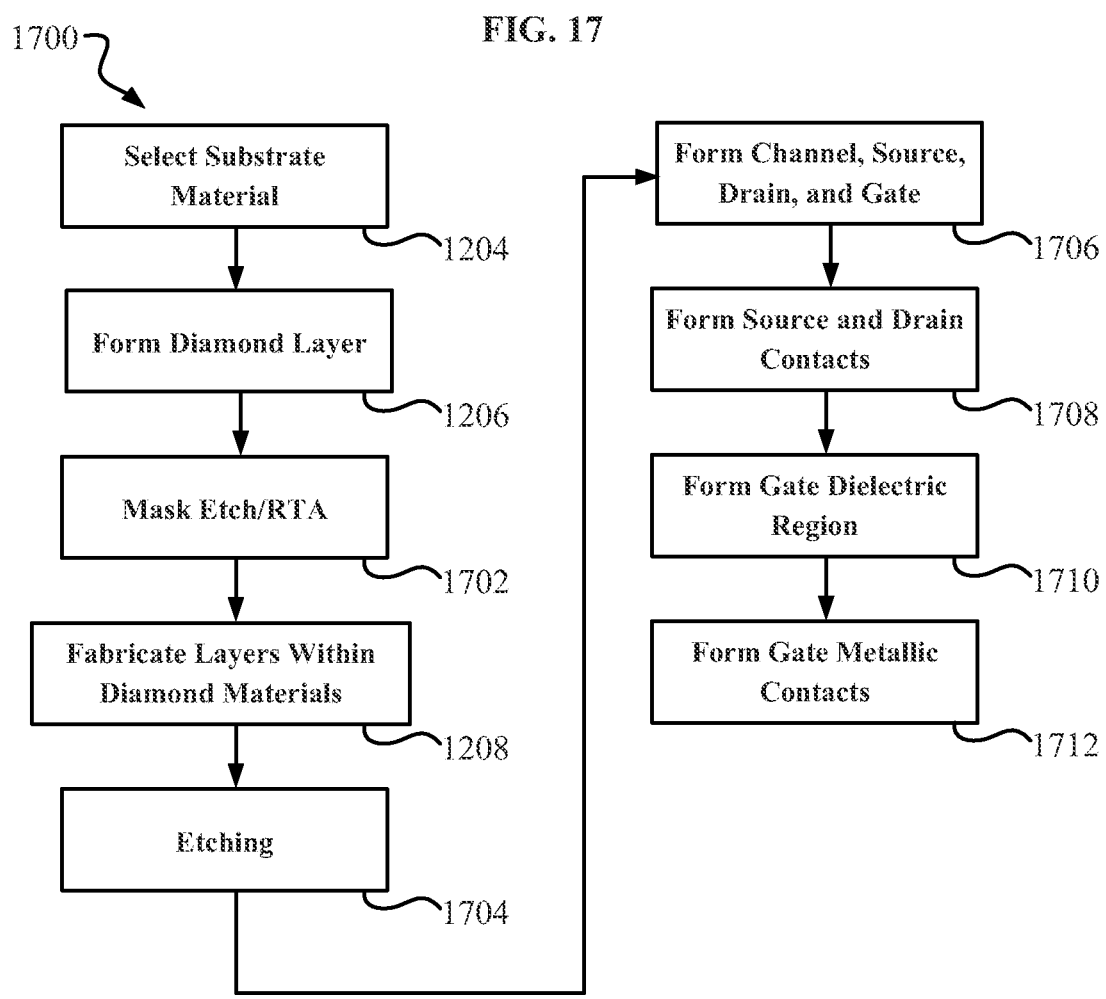
FIG. 17 is a block diagram of a method for forming a transistor element from diamond semiconductor materials.

FIG. 17 shows a block diagram of an embodiment of a method 1700 for forming a transistor element, for example transistor element 1800 (see FIG. 18), from diamond semiconductor materials. The first step of method 1700 may be the same as the first step 1202 of method 1200, which includes selecting a substrate material, for example substrate material 1306. The second step of method 1700 may be the same as the third step 1206 of method 1200, which includes forming a diamond layer upon the substrate materials, for example, intrinsic diamond layer 1304. The method 1700 may include a third step 1702 of applying an acid clean and an implant mask. Third step 1702 may include applying cleaners known in the art, such as Pirahna, such that dangling bonds may be substantially removed and such that crystal smoothness is attained.

The fourth step of method 1700 may be the same as the fourth step 1208 of method 1200, which includes fabricating layers within diamond materials. The method 1700 may include a fifth step 1704 of etching the diamond surface to again remove dangling bonds and improve crystal smoothness. The method 1700 may include a sixth step 1706 of forming a channel, a source, a drain, and a gate region, for example through further etching. In some embodiments, the channel may be include, for example, graphene and CNT that may provide increased electron mobility and improved electronic characteristics. The method 1700 may include a seventh step 1708 of forming contacts for the source and the drain. The method 1700 may include an eighth step 1710 of forming a gate dielectric region. Dielectric materials may include aluminum oxide and polysilicon materials. The method 1700 may include a ninth step 1712 of forming a gate metallic contact, for example aluminum gate contacts. In addition to transistors as described, the steps described in method 1700 may be used to form devices such as microwave devices, logic devices and power conditioning devices, all of which may be formed monolithically using diamond semiconductor materials.

Figure 18:
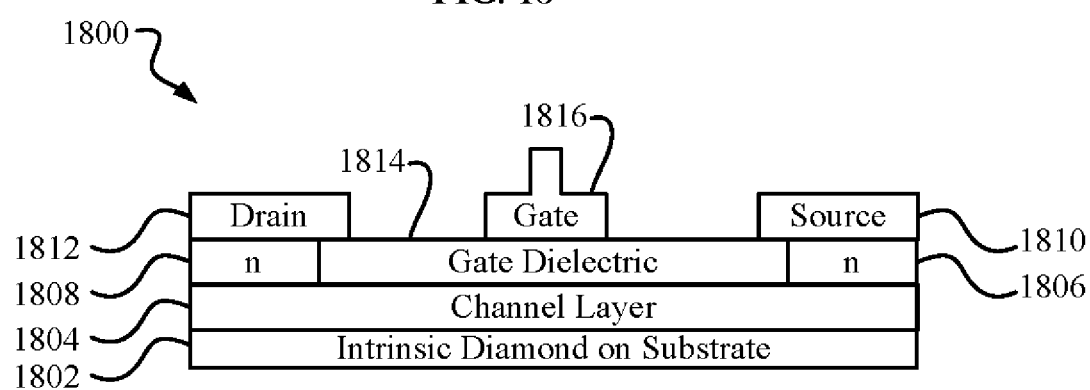
FIG. 18 is a model of a transistor that may be fabricated according to the method of FIG. 17.

FIG. 18 is a model of a transistor 1800 that may be fabricator according to the method of FIG. 17. A transistor, such as transistor 1800, may be fabricated, in part, according to method 1700. Transistor 1800 may include an intrinsic diamond and substrate layer 1802, a channel layer 1804, a source 1806, a drain 1808, a source contact 1810, and drain contact 1812, a gate dielectric 1814 and a gate contact 1816.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

What is claimed is:

1. A method of fabricating a monolithically integrated diamond semiconductor, the method including the steps of:
   seeding the surface of a substrate material;
   forming a diamond layer upon the surface of the substrate material; and forming a semiconductor layer within the diamond layer, wherein the semiconductor layer has n-type donor atoms and a diamond lattice, wherein the n-type donor atoms are introduced to the lattice through ion tracks, wherein the ion track are created using p-type acceptor dopant atoms.

2. The method of fabricating a monolithically integrated diamond semiconductor of claim 1, wherein the substrate material is selected from the group consisting of silicon, silicon oxide, refractory metal, glass, and wide band gap semiconductor material.

3. The method of fabricating a monolithically integrated diamond semiconductor of claim 1, wherein the diamond layer is formed using chemical vapor deposition.

4. The method of fabricating a monolithically integrated diamond semiconductor of claim 1, wherein the diamond layer is formed at or below 450 degrees Celsius.

5. A monolithically integrated diamond semiconductor device formed according to the method of claim 1.

6. The monolithically integrated diamond semiconductor device of claim 5, wherein the device is one of a group consisting of an LED, an attenuator, an amplifier, a switch, and a sensor.

7. The monolithically integrated diamond semiconductor device of claim 5, wherein the device includes logic elements.

8. The monolithically integrated diamond semiconductor device of claim 7, wherein the device is one of a group consisting of a transistor and a diode.

9. A monolithically integrated diamond semiconductor formed according to the method of claim 1, wherein the diamond semiconductor of the semiconductor layer has a concentration between $8 \times 10^{17}/cm^3$ and $2 \times 10^{18}/cm^3$ of the n-type donor atoms.

* * * * *